United States Patent
Wang et al.

(10) Patent No.: US 12,431,382 B2
(45) Date of Patent: Sep. 30, 2025

(54) INTEGRATED WAFER DEBONDING AND CLEANING APPARATUS AND DEBONDING AND CLEANING METHOD

(71) Applicant: GRAND PROCESS TECHNOLOGY CORPORATION, Hsinchu (TW)

(72) Inventors: Chih-cheng Wang, Hsinchu (TW); Zong-en Wu, Hsinchu (TW); Yun-cheng Chiu, Hsinchu (TW)

(73) Assignee: GRAND PROCESS TECHNOLOGY CORPORATION, Hsinchu (TW)

( * ) Notice: Subject to any disclaimer, the term of this patent is extended or adjusted under 35 U.S.C. 154(b) by 397 days.

(21) Appl. No.: 18/104,982

(22) Filed: Feb. 2, 2023

(65) Prior Publication Data

US 2023/0386885 A1 Nov. 30, 2023

(30) Foreign Application Priority Data

May 27, 2022 (TW) .................................. 111119934

(51) Int. Cl.
*H01L 21/683* (2006.01)
*H01L 21/67* (2006.01)

(52) U.S. Cl.
CPC .... *H01L 21/6835* (2013.01); *H01L 21/67092* (2013.01); *H01L 2221/68381* (2013.01)

(58) Field of Classification Search
CPC ............. H01L 21/6836; H01L 21/6835; H01L 21/02115; H01L 21/02274; H01L 2221/68327; H01L 2221/68381; H01L 2221/68318; H01L 2221/6834; H01L 21/78; B32B 43/006; B32B 2457/14; C23C 16/26

(Continued)

(56) References Cited

U.S. PATENT DOCUMENTS 8,758,553 B2 * 6/2014 Riege ................ H01L 21/67092
156/763
8,921,239 B2 * 12/2014 Belle ................. H01L 21/76251
438/795

(Continued)

FOREIGN PATENT DOCUMENTS

CN 209487476 U 10/2019
CN 112967993 A 6/2021

(Continued)

*Primary Examiner* — Vu A Vu
(74) *Attorney, Agent, or Firm* — The Roy Gross Law Firm, LLC; Roy D. Gross

(57) ABSTRACT

An integrated wafer debonding and cleaning apparatus and a debonding and cleaning method are provided. The integrated wafer debonding and cleaning apparatus includes an input port, a debonding module, a wafer cleaning device, and a transport device. The input port is configured to allow a substrate to be processed to enter the integrated wafer debonding and cleaning apparatus. The substrate to be processed includes a wafer and a carrier which are bonded. The debonding module is configured to debond the substrate to be processed, and to separate the wafer from the carrier. The wafer cleaning apparatus is configured to clean the wafer. The transport device is configured to transfer the substrate to be processed, the wafer, and the carrier. The debonding module and the wafer cleaning module are integrated in one apparatus for continuous processing.

16 Claims, 4 Drawing Sheets

(58) Field of Classification Search
USPC .......................................................... 438/113
See application file for complete search history.

(56) References Cited

U.S. PATENT DOCUMENTS

| | | | | |
|---|---|---|---|---|
| 9,048,271 | B2* | 6/2015 | Oosterlaken | ...... H01L 21/67184 |
| 9,437,468 | B2* | 9/2016 | Brun | ................. H01L 21/31133 |
| 10,155,369 | B2* | 12/2018 | Tsao | ......................... B32B 38/10 |
| 11,437,257 | B2* | 9/2022 | Moriya | ............. H01L 21/67742 |
| 2012/0132412 | A1* | 5/2012 | Yamamoto | ........ H01L 21/67109 |
| | | | | 165/47 |
| 2013/0085593 | A1 | 4/2013 | Oosterlaken | |
| 2013/0146229 | A1 | 6/2013 | Hirakawa et al. | |

FOREIGN PATENT DOCUMENTS

| | | |
|---|---|---|
| CN | 217426688 U | 9/2022 |
| TW | 201320225 A | 5/2013 |
| TW | M606787 U | 1/2021 |
| WO | 2012176629 A1 | 12/2012 |
| WO | 2016090636 A1 | 6/2016 |

* cited by examiner

INTEGRATED WAFER DEBONDING AND CLEANING APPARATUS AND DEBONDING AND CLEANING METHOD

CROSS REFERENCE TO RELATED APPLICATIONS

This application claims priority to Taiwan Application Serial No. 111119934, filed May 27, 2022, the disclosure of which is incorporated herein by reference.

FIELD OF DISCLOSURE

The present disclosure relates to a wafer debonding device, in particular to an integrated wafer debonding and cleaning apparatus and a debonding and cleaning method.

BACKGROUND

With an introduction of new consumer electronic products, high-end chips, for such as 5G communication and CPU/GPU, are developing towards high frequency and high speed, multi-function, high performance, small size, and high reliability. In order to meet requirements of chip miniaturization, multi-function, and intelligence, a development of Moore's Law has reached a physical limit. Packaging technology will play a role in assisting a continuous development of Moore's Law in a manufacture of integrated circuit chips. A development of advanced packaging technologies is mainly focused on 3D-IC stack packaging, which not only reduces a packaging size, but also improves circuit performance, and reduces parasitic effects and time delay. At present, integrated circuits have two important characteristics. One is that a front-end IC manufacturing is close to the physical limit, and the development of Moore's Law is slowing down. The second is the diversification of microelectronics products, and innovations in other technologies, such as mobile computing, cloud data centres, Internet of Things, artificial intelligence, 5G communications, etc.

In order to meet needs of multi-functional integrated circuits and thinner products, and further promote the development of new technologies such as 3D-IC, system-in-package, and heterogeneous integration, the thinning of wafers and the technology of holding thinner wafers are becoming more and more important. Therefore, temporary bonding and debonding technologies have become key processes in advanced manufacturing and packaging. As a chip size of advanced packaging becomes smaller, the wafer becomes thinner and thinner. When a thickness of the wafer is less than 200 warpage or even breakage occurs.

SUMMARY OF DISCLOSURE

In order to overcome technical problems in the prior art, the present disclosure provides an integrated wafer debonding and cleaning apparatus and a debonding and cleaning method, which integrates a debonding module and a wafer cleaning module in the same apparatus for performing a continuous process.

In one aspect, the present disclosure provides an integrated wafer debonding and cleaning apparatus, including an input port, a debonding module, a wafer cleaning device, a first output port, a second output port, and a transport device. The input port is configured to allow a substrate to be processed to enter the integrated wafer debonding and cleaning apparatus. The substrate to be processed includes a wafer and a carrier which are bonded. The debonding module is configured to debond the substrate to be processed, and to separate the wafer from the carrier. The wafer cleaning device is configured to clean the wafer. The first output port is configured to allow the cleaned wafer to exit the integrated wafer debonding and cleaning apparatus. The second output port is configured to allow the carrier to exit the integrated wafer debonding and cleaning apparatus. The transport device is configured to transport the substrate to be processed, the wafer, and the carrier. The transport device runs between the input port, the debonding module, the wafer cleaning device, the first output port, and the second output port.

In some embodiments, the debonding module includes a movable stage, a debonding region, and a debonding device, the debonding device is arranged in the debonding region, and in response to the transport device moving the substrate to be processed onto the movable stage and the movable stage is located in the debonding region, the debonding device is configured to debond the substrate to be processed.

In some embodiments, the debonding module further includes a first optical detection device arranged in the debonding region, and the first optical detection device is configured to detect the substrate to be processed which is not debonded.

In some embodiments, in response to the debonding device debonding the substrate to be processed, the substrate to be processed is disposed between the movable stage and the debonding device, and the carrier of the substrate to be processed is arranged close to the debonding device, and the wafer is arranged away from the debonding device.

In some embodiments, the debonding module further includes a separation region, the movable stage moves between the debonding region and the separation region, the debonding module further includes a separation device arranged in the separation region, and in response to the movable stage moving the debonded substrate to be processed to the separation region, the separation device is configured to separate the carrier of the substrate to be processed from the wafer.

In some embodiments, the debonding module further includes a second optical detection device disposed in the separation region, and the second optical detection device is configured to detect the carrier which is separated from the wafer.

In some embodiments, the debonding module further includes a temporary storage area configured to store the carrier.

In some embodiments, the wafer cleaning device includes a first chamber and a second chamber, and the first chamber and the second chamber are respectively configured to clean two opposite surfaces of the wafer.

In some embodiments, the integrated wafer debonding and cleaning apparatus further includes a positioning device and a turning mechanism. The positioning device is configured to perform a central point positioning operation on the substrate to be processed, and the turning mechanism is configured to turn-over the substrate to be processed or the wafer.

In another aspect, the present disclosure also provides a wafer debonding and cleaning method suitable for an integrated wafer debonding and cleaning apparatus, the integrated wafer debonding and cleaning apparatus including an input port, a debonding module, a wafer cleaning device, a first output port, a second output port, and a transport device, and the wafer debonding and cleaning method including:

inputting a substrate to be processed into the integrated wafer debonding and cleaning apparatus through the input port, where the substrate to be processed includes a wafer and a carrier which are bonded;

transporting the substrate to be processed to the debonding module through the transport device;

debonding the substrate to be processed and separating the wafer from the carrier by the debonding module;

transporting the wafer to the wafer cleaning device through the transport device;

cleaning the wafer by the wafer cleaning device;

transporting the cleaned wafer and the carrier to the first output port and the second output port respectively by the transport device; and outputting the wafer and the carrier from the integrated wafer debonding and cleaning apparatus through the first output port and the second output port.

In some embodiments, the debonding module includes a movable stage, a debonding region, and a debonding device, the debonding device is arranged in the debonding region, and the wafer debonding and cleaning method further includes:

debonding the substrate to be processed by the debonding device when the substrate to be processed is moved onto the movable stage by the transport device and the movable stage is located in the debonding region.

In some embodiments, the debonding module further includes a first optical detection device arranged in the debonding region, and the wafer debonding and cleaning method further includes:

detecting the substrate to be processed by the first optical detection device before the substrate to be processed is debonded.

In some embodiments, when the substrate to be processed is debonded by the debonding device, the substrate to be processed is disposed between the movable stage and the debonding device, and the carrier of the substrate to be processed is arranged close to the debonding device, and the wafer is arranged away from the debonding device.

In some embodiments, the debonding module further includes a separation region, the movable stage moves between the debonding region and the separation region, the debonding module further includes a separation device arranged in the separation region, and the wafer debonding and cleaning method further includes:

separating the carrier of the substrate to be processed from the wafer by the separation device when the debonded substrate to be processed is moved to the separation region by the movable stage.

In some embodiments, the debonding module further includes a second optical detection device disposed in the separation region, and the wafer debonding and cleaning method further includes:

detecting the carrier by the second optical detection device after the separation device separates the carrier from the wafer.

In some embodiments, the debonding module further includes a temporary storage area configured to store the carrier.

In some embodiments, the wafer cleaning device includes a first chamber and a second chamber, and the wafer debonding and cleaning method further includes:

transporting the wafer to the first chamber;
cleaning a first surface of the wafer in the first chamber;
taking the wafer out of the first chamber and turning it over;
transporting the turned-over wafer to the second chamber; and
cleaning a second surface of the wafer in the second chamber.

In some embodiments, the integrated wafer debonding and cleaning apparatus further includes a positioning device and a turning mechanism, the positioning device is configured to perform a central point positioning operation on the substrate to be processed, and the turning mechanism is configured to turn-over the substrate to be processed or the wafer.

In comparison with the prior art, the present disclosure directly performs a double-sided cleaning process on the debonded and separated wafer to perform a continuous process, thereby saving process time and increasing productivity. Furthermore, the online optical detection device is used to monitor whether the carrier is cracked or damaged in real time, so that the broken carrier can be quickly removed to eliminate process variability. Therefore, the movable stage of the debonding module can be kept clean, thereby improving the continuity of operation, and keeping the debonding module running smoothly.

DETAILED DESCRIPTION

In order to make the above and other purposes, features, and advantages of the present disclosure more comprehensible, preferred embodiments of the present disclosure will be described below in detail together with the accompanying drawings.

In order to successfully hold ultra-thin wafer (thin wafer handling) in a thin wafer manufacturing process, it is necessary to use a temporary bonding technology to bond a thin wafer to a thick carrier, so as to provide sufficient mechanical support and ensure that the wafer can successfully complete subsequent processing processes, such as lithography, etching, passivation, sputtering, electroplating, and reflow, etc. After the above process is completed, the wafer and the carrier are debonded to separate the wafer from the carrier.

There will be foreign matter, such as residual glue, on a surface of the debonded wafer. In the prior art, the wafer is transport to a downstream cleaning equipment through a transfer port of a debonding module. However, the transfer port where the wafer is temporarily placed is easily contaminated by the residual glue of the wafer. Furthermore, a long-distance transport from the debonding module to a cleaning equipment will cause the wafer to easily attach extra foreign matter, which in turn makes it difficult to clean the wafer. In order to prevent problems such as the above, the present disclosure provides an integrated wafer debonding and cleaning apparatus and a wafer debonding and cleaning method.

Figure 1:
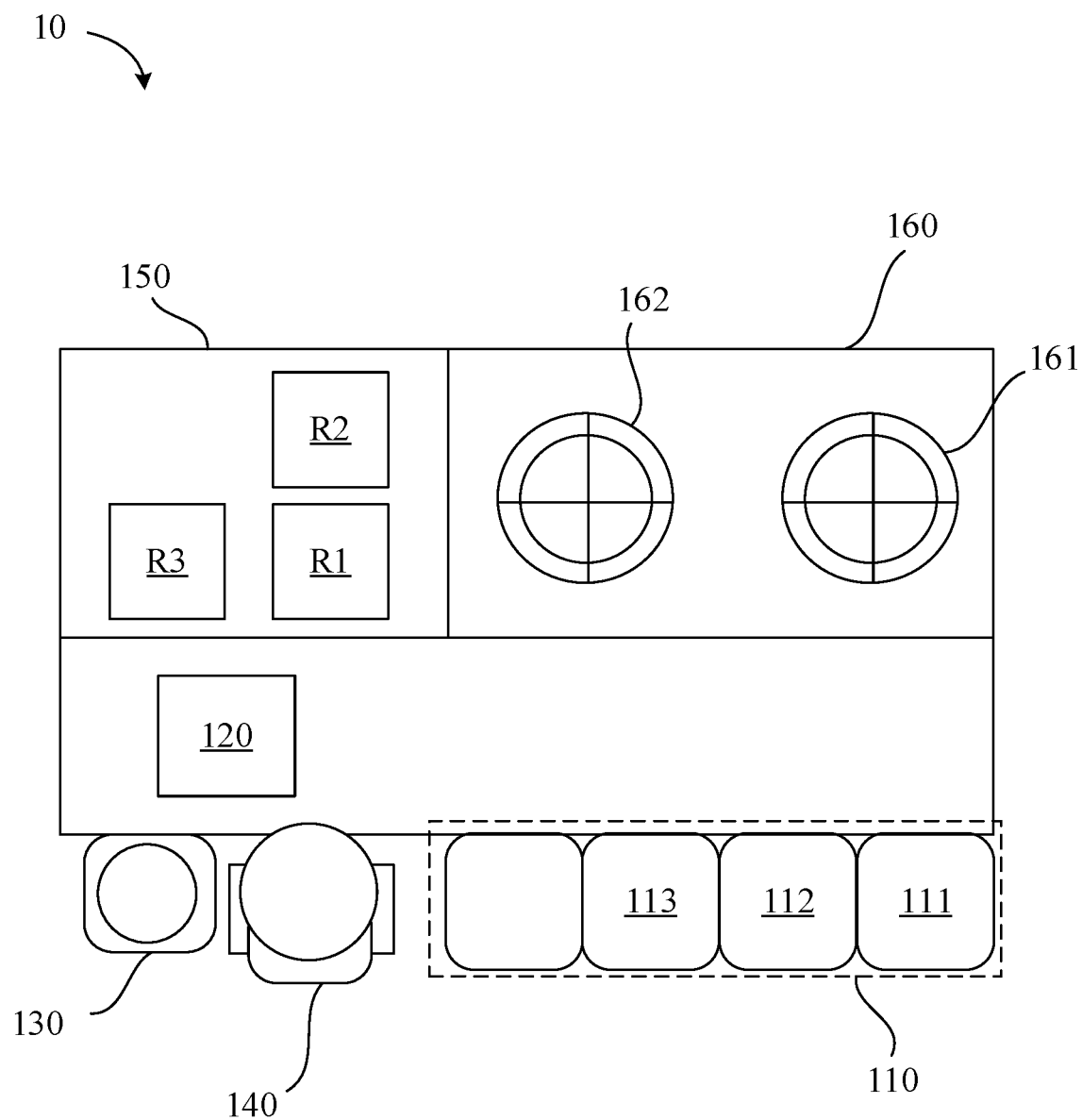
FIG. 1 shows a schematic diagram of an integrated wafer debonding and cleaning apparatus according to an embodiment of the present disclosure.

Referring to FIG. 1, which shows a schematic diagram of an integrated wafer debonding and cleaning apparatus according to an embodiment of the present disclosure. The integrated wafer debonding and cleaning apparatus 10 includes ports for inlet and outlet 110, a transport device 120, a positioning device 130, a turning mechanism 140, a debonding module 150, and a wafer cleaning device 160. The integrated wafer debonding and cleaning apparatus 10 is an independent and closed workstation in a single area, and the transport device 120 is within a range of the workstation. The transport device 120 runs between the ports for inlet and outlet 110, the positioning device 130, the turning mechanism 140, the debonding module 150, and the wafer cleaning device 160 through an internal track of the integrated wafer debonding and cleaning apparatus 10.

Figure 3A:
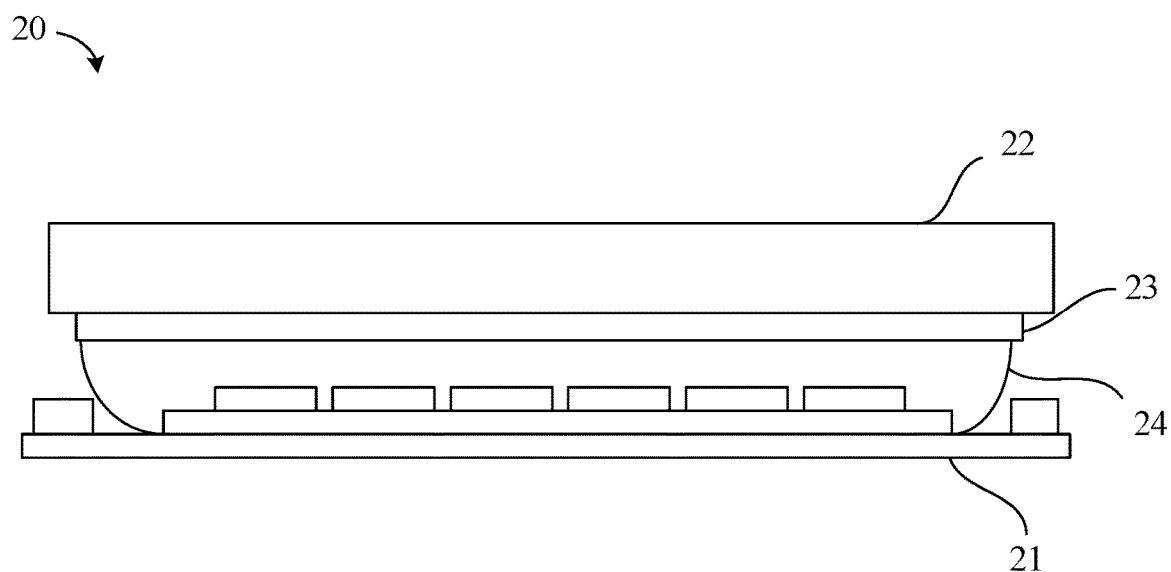
FIG. 3A to FIG. 3C show schematic diagrams illustrating a separation process of a wafer and a carrier according to an embodiment of the present disclosure.

As shown in FIG. 1, the ports for inlet and outlet 110 includes at least three input/output ports, and the at least three input/output ports can be selectively designated as an input port 111, a first output port 112, and a second output port 113. The input port 111 is configured to allow a substrate to be processed to enter an interior of the integrated wafer debonding and cleaning apparatus 10. Referring to FIG. 3A, which shows a schematic diagram of the substrate to be processed. The substrate to be processed 20 includes a wafer 21 and a carrier 22 which are bonded. For example, the wafer 21 and the carrier 22 can be bonded through a separation layer 23 and an adhesive layer 24. After being processed by the integrated wafer debonding and cleaning apparatus 10, the wafer 21 of the substrate to be processed 20 is separated from the carrier 22, and the wafer 21 and the carrier 22 are independent of each other. The first output port 112 is configured to allow the cleaned wafer 21 to exit the integrated wafer debonding and cleaning apparatus 10. The second output port 113 is configured to allow the carrier 22 to exit the integrated wafer debonding and cleaning apparatus 10.

As shown in FIG. 1, the transport device 120 is configured to transport the substrate to be processed 20, the wafer 21, and the carrier 22. The transport device 120 runs between the input port 111, the first output port 112, the second output port 113, the positioning device 130, the turning mechanism 140, the debonding module 150, and the wafer cleaning device 160. In some embodiments, the transport device 120 includes a robotic arm.

As shown in FIG. 1, when the substrate to be processed 20 is input through the input port 111, the substrate to be processed 20 is firstly transferred to the positioning device 130 via the transport device 120 for performing a central point positioning operation. Then, the substrate to be processed 20 is turned over by using the turning mechanism 140 so that the carrier 22 of the substrate to be processed 20 faces upward.

As shown in FIG. 1, the turned-over substrate to be processed 20 is transport to the debonding module 150. The debonding module 150 is configured to debond the substrate to be processed 20 and to separate the wafer 21 from the carrier 22 to cause the wafer 21 and the carrier 22 are independent of each other.

Figure 2:
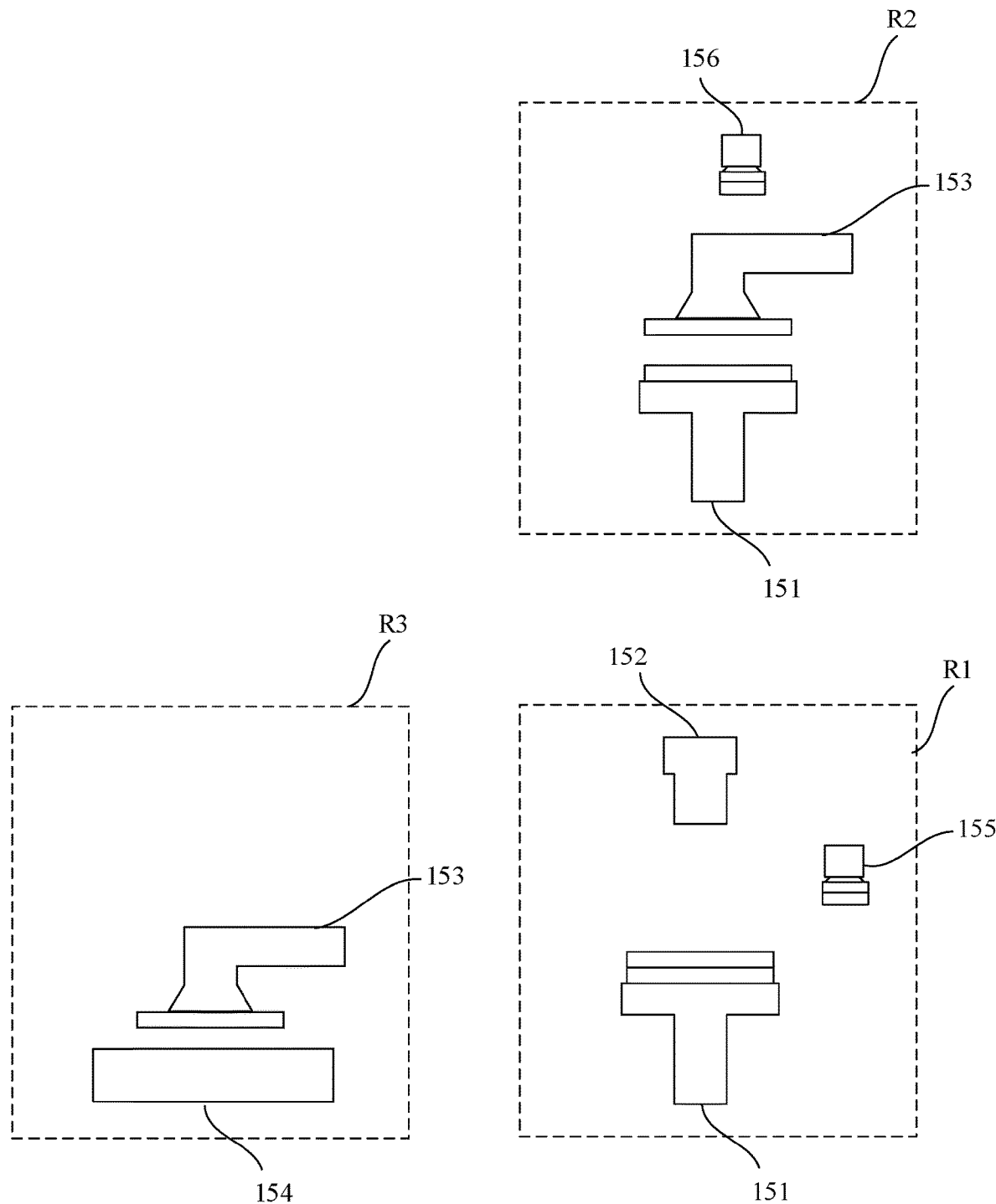
FIG. 2 shows a schematic diagram of a debonding module according to an embodiment of the present disclosure.

Referring to FIG. 1 and FIG. 2, FIG. 2 shows a schematic diagram of a debonding module of according to an embodiment of the present disclosure. The debonding module 150 defines a debonding region R1, a separation region R2, and a temporary storage area R3. The debonding module 150 includes a movable stage 151, a debonding device 152, a separation device 153, a platform 154, a first optical detection device 155, and a second optical detection device 156. The movable stage 151 can move between the debonding region R1 and the separation region R2. The debonding device 152 and the first optical detection device 155 are arranged in the debonding region R1. The separation device 153 can move between the separation region R2 and the temporary storage area R3. The second optical detection device 156 is arranged in the separation region R2. The platform 154 is arranged in the temporary storage area R3.

As shown in FIG. 1 and FIG. 2, when the transport device 120 moves the substrate to be processed 20 onto the movable stage 151 and the movable stage 151 is located in the debonding region R1, the debonding device 152 is configured to debond the substrate to be processed 20. At this time, the carrier 22 of the substrate to be processed 20 is located at a top. That is, when the debonding device 152 debonds the substrate to be processed 20, the substrate to be processed 20 is disposed between the movable stage 151 and the debonding device 152. Also, the carrier 22 of the substrate to be processed 20 is arranged close to the debonding device 150, and the wafer 21 is arranged away from the debonding device 152.

In some embodiments, the debonding device 152 includes a laser head. The carrier 22 of the substrate to be processed 20 is irradiated with laser light to debond, so that the bonded glue loses its adhesiveness. In other embodiments, other types of debonding devices may also be used, but is not limited thereto. Preferably, the debonding region R1 is provided with a protective cover. An upper portion of the debonding region R1 is connected to an exhaust system of a factory, and a lower portion of the debonding region R1 allows the movable stage 151 to move in a straight line. In the present disclosure, since the debonding device 152 remains stationary and the substrate to be processed 20 is moved by the movable stage 151, parameters of the debonding device 152 (such as a focal length) will not change, thereby improving the accuracy and stability of the process.

In some embodiments, before the substrate to be processed 20 is debonded (i.e., the substrate to be processed 20 is not debonded), the first optical detection device 155 (such as an AOI instrument) may be used to detect whether the substrate to be processed 20 is broken or not. If the substrate to be processed 20 is not broken, the debonding process can be performed. If the substrate to be processed 20 is broken, the debonding process will not be performed, and the integrated wafer debonding and cleaning apparatus 10 can issue an alarm accordingly, and the transport device 120 is controlled to automatically take out the substrate to be processed 20.

As shown in FIG. 1 and FIG. 2, when the movable stage 151 moves the debonded substrate to be processed 20 to the separation region R2, the separation device 153 is configured to separate the carrier 22 of the substrate to be processed 20 from the wafer 21. Specifically, after debonding, the movable stage 151 moves from the debonding region R1 to the separation region R2 along a straight line, and then the carrier 22 is pulled up to separate the wafer 21 from the carrier 22.

Figure 3B:
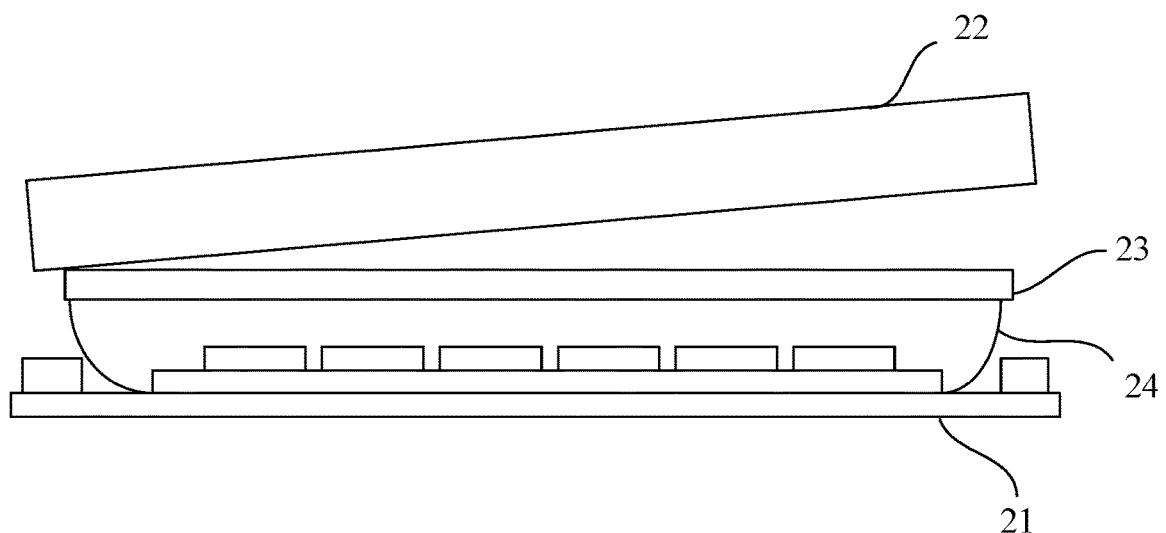
Figure 3C:
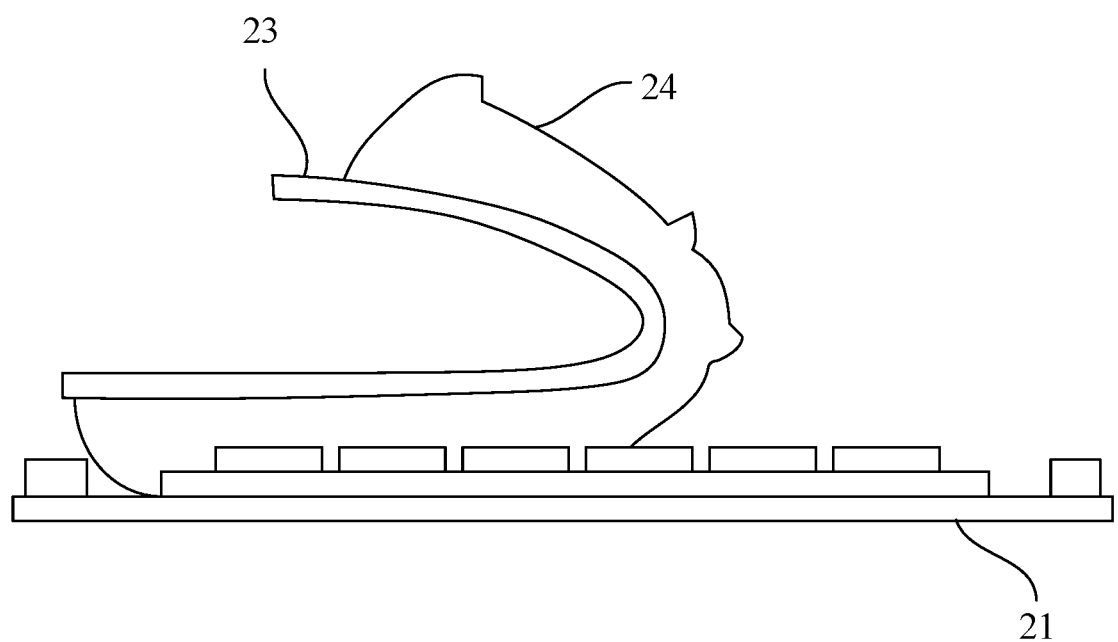

Referring to FIG. 3A to FIG. 3C, which show schematic diagrams illustrating a separation process of a wafer and a carrier according to an embodiment of the present disclosure. As shown in FIG. 3A, the substrate to be processed 20 includes the wafer 21 and the carrier 22 which are bonded by the separation layer 23 and the adhesive layer 24. After the separation device 153 moves down to contact with the substrate to be processed 20, it is fixed with the carrier 22 by sucking or clamping. As shown in FIG. 3B, the separation device 153 pulls up the carrier 22 so that the carrier 22 is separated from the wafer 21 by the separation layer 23. As shown in FIG. 3C, a second separation operation is performed to remove the separation layer 23 and the adhesive layer 24 from the wafer 21. Alternatively, the separation layer 23 and the adhesive layer 24 can also be removed by the subsequent wafer cleaning device 160.

In some embodiments, the separation region R2 is provided with the second optical detection device 156 (such as an AOI instrument). The second optical detection device 156 is configured to detect whether the carrier 22 separated from the wafer is broken or not. If the carrier 22 is not broken, the carrier 22 is moved to the temporary storage area R3 by the separation device 153, and the separated carrier 22 is placed on the platform 154. The transport device 120 can transport the carrier 22 from the platform 154 to the second output port 113. On the other hand, if the second optical detection device 156 detects that the carrier 22 is broken, the integrated wafer debonding and cleaning apparatus 10 can issue a fault alarm accordingly, and then the fault can be eliminated by manual or automated equipment (such as taking out the broken carrier 22).

As shown in FIG. 1, the wafer cleaning device 160 includes a first chamber 161 and a second chamber 162. The first chamber 161 and the second chamber 162 are respectively configured to clean two opposite surfaces of the wafer 21. Specifically, after the wafer 21 is separated from the carrier 22, the transport device 120 transfers the wafer 21 to the first chamber 161 to clean a first surface of the wafer 21 with residual glue (such as the residual separation layer 23 and adhesive layer 24). Then, the transport device 120 takes the wafer 21 out of the first chamber 161 and transfers it to the turning mechanism 140. The wafer 21 is turned over by the turning mechanism 140 so that a second surface of the wafer 21 faces upward. Then, the transport device 120 transports the wafer 21 from the turning mechanism 140 to the second chamber 162 to clean the second surface of the wafer. After the two surfaces of the wafer are cleaned, the wafer 21 is transported to the first output port 112 by the transport device 120 to be transferred to a downstream end.

On the other hand, the present disclosure also provides a wafer debonding and cleaning method. The wafer debonding and cleaning method is suitable for the above-mentioned integrated wafer debonding and cleaning apparatus. As shown in FIG. 1, the integrated wafer debonding and cleaning apparatus 10 includes ports for inlet and outlet 110, a transport device 120, a positioning device 130, a turning mechanism 140, a debonding module 150, and a wafer cleaning device 160. The ports for inlet and outlet 110 include at least three input/output ports. The at least three input/output ports are selectively designated as an input port 111, a first output port 112, and a second output port 113.

As shown in FIG. 1, the wafer debonding and cleaning method of the present disclosure includes the following steps. First, a substrate to be processed 20 is input into an inside of the integrated wafer debonding and cleaning apparatus 10 through the input port 111. As shown in FIG. 3A, the substrate to be processed 20 includes a bonded wafer 21 and a carrier 22. Then, the substrate to be processed 20 is transported to the debonding module 150 through the transport device 120.

As shown in FIG. 1, when the substrate to be processed 20 is disposed on the debonding module 150, the substrate to be processed 20 is debonded and the wafer 21 and the carrier 22 are separated by the debonding device 152 to cause the wafer 21 and the carrier 22 are independent of each other. Then, after the substrate to be processed 20 is debonded and separated, the separated wafer 21 is transferred to the wafer cleaning device 160 by the transport device 120, and the wafer 21 is cleaned by the wafer cleaning device 160.

As shown in FIG. 1, after both surfaces of the wafer 21 are cleaned, the cleaned wafer 21 and carrier 22 are respectively transported to the first output port 112 and the second output port 113 by the transport device 120. Then, the wafer 21 and the carrier 22 are respectively output from the integrated wafer debonding and cleaning apparatus 10 to an outside through the first output port 112 and the second output port 113.

Referring to FIG. 1 and FIG. 2, the debonding module 150 defines a debonding region R1, a separation region R2, and a temporary storage area R3. The debonding module 150 includes a movable stage 151, a debonding device 152, a separation device 153, a platform 154, a first optical detection device 155, and a second optical detection device 156. The movable stage 151 can move between the debonding region R1 and the separation region R2. The debonding device 152 and the first optical detection device 155 are arranged in the debonding region R1. The separation device 153 can move between the separation region R2 and the temporary storage area R3. The second optical detection device 156 is arranged in the separation region R2. The platform 154 is arranged in the temporary storage area R3.

In some embodiments, when the transport device 120 moves the substrate to be processed onto the movable stage 151 and the movable stage 151 is located in the debonding region R1, the wafer debonding and cleaning method of the present disclosure includes following steps. The substrate to be processed 20 is debonded by the debonding device 152. When the debonding device 152 debonds the substrate to be processed 20, the substrate to be processed 20 is arranged between the movable stage 151 and the debonding device 152, and the carrier 22 of the substrate to be processed 20 is arranged close to the debonding device 152, and the wafer 21 is arranged away from the debonding device 152.

In some embodiments, before debonding the substrate to be processed 20, the wafer debonding and cleaning method of the present disclosure includes following steps. The substrate to be processed 20 is detected by the first optical detection device 155.

In some embodiments, when the movable stage 151 moves the debonded substrate to be processed 20 to the separation region R2, the wafer debonding and cleaning method of the present disclosure includes following steps. The carrier 22 and the wafer 21 of the substrate to be processed are separated by the separation device 153. Preferably, the separation device 153 moves the carrier 22 to the temporary storage area R3, and moves the separated carrier 22 onto the platform 154.

In some embodiments, after the separation device 153 separates the carrier 22 from the wafer 21, the carrier 22 is detected by the second optical detection device 156.

As shown in FIG. 1, the wafer cleaning device 160 includes a first chamber 161 and a second chamber 162. The first chamber 161 and the second chamber 162 are respectively configured to clean two opposite surfaces of the wafer 21. Specifically, after the wafer 21 is separated from the carrier 22, the transport device 120 transfers the wafer 21 to the first chamber 161. A first surface of the wafer 21 with residual glue (such as the residual separation layer 23 and adhesive layer 24) is cleaned in the first chamber 161. Then, the transport device 120 takes the wafer 21 out of the first chamber 161 and transfers it to the turning mechanism 140. The wafer 21 is turned over by the turning mechanism 140 so that a second surface of the wafer 21 faces upward. Then, the transport device 120 transports the wafer 21 from the turning mechanism 140 to the second chamber 162. The second surface of the wafer is cleaned in the second chamber 162. After the two surfaces of the wafer are cleaned, the wafer 21 is transported to the first output port 112 by the transport device 120 to be transferred to a downstream end.

It should be understood that, in the wafer debonding and cleaning method of the present disclosure, specific debonding steps, cleaning steps, transfer steps, detection steps, relative component arrangement, and associated advantages are as described in the corresponding paragraphs of the above integrated wafer debonding and cleaning apparatus 10, and will not be repeated here.

In summary, the present disclosure provides the integrated wafer debonding and cleaning apparatus and the wafer debonding and cleaning method. In the present disclosure, the bonded wafer and carrier are transported to the movable stage of the debonding module, and the adhesive is debonded by the debonding device in the debonding region. When the adhesive is debonded, the movable stage moves back and forth between the debonding region and the separation region along a straight line. In the separation region, the carrier is pulled up by the separation device to separate the wafer from the carrier. In comparison with the prior art, the present disclosure directly performs a double-sided cleaning process on the debonded and separated wafer to perform a continuous process, thereby saving process time and increasing productivity. Furthermore, the online optical detection device is used to monitor whether the carrier is cracked or damaged in real time, so that the broken carrier can be quickly removed to eliminate process variability. Therefore, the movable stage of the debonding module can be kept clean, thereby improving the continuity of operation, and keeping the debonding module running smoothly.

The above are only the preferred implementations of the present disclosure, and it should be pointed out that for those skilled in the art, some improvements and modifications can be made without departing from the principle of the present disclosure. These improvements and modifications should also be regarded as the scope of protection of this disclosure.

What is claimed is:

1. An integrated wafer debonding and cleaning apparatus, comprising:
   an input port configured to allow a substrate to be processed to enter the integrated wafer debonding and cleaning apparatus, wherein the substrate to be processed comprises a wafer and a carrier which are bonded;
   a debonding module configured to debond the substrate to be processed, and to separate the wafer from the carrier;
   a wafer cleaning device configured to clean the wafer;
   a first output port configured to allow the cleaned wafer to exit the integrated wafer debonding and cleaning apparatus;
   a second output port configured to allow the carrier to exit the integrated wafer debonding and cleaning apparatus; and
   a transport device configured to transport the substrate to be processed, the wafer, and the carrier, wherein the transport device runs between the input port, the debonding module, the wafer cleaning device, the first output port, and the second output port; and
   wherein the wafer cleaning device comprises a first chamber and a second chamber, and the first chamber and the second chamber are respectively configured to clean two opposite surfaces of the wafer.

2. The integrated wafer debonding and cleaning apparatus according to claim 1, wherein the debonding module comprises a movable stage, a debonding region, and a debonding device, the debonding device is arranged in the debonding region, and in response to the transport device moving the substrate to be processed onto the movable stage and the movable stage is located in the debonding region, the debonding device is configured to debond the substrate to be processed.

3. The integrated wafer debonding and cleaning apparatus according to claim 2, wherein the debonding module further comprises a first optical detection device arranged in the debonding region, and the first optical detection device is configured to detect the substrate to be processed which is not debonded.

4. The integrated wafer debonding and cleaning apparatus according to claim 2, wherein in response to the debonding device debonding the substrate to be processed, the substrate to be processed is disposed between the movable stage and the debonding device, and the carrier of the substrate to be processed is arranged close to the debonding device, and the wafer is arranged away from the debonding device.

5. The integrated wafer debonding and cleaning apparatus according to claim 2, wherein the debonding module further comprises a separation region, the movable stage moves between the debonding region and the separation region, the debonding module further comprises a separation device arranged in the separation region, and in response to the movable stage moving the debonded substrate to be processed to the separation region, the separation device is configured to separate the carrier of the substrate to be processed from the wafer.

6. The integrated wafer debonding and cleaning apparatus according to claim 5, wherein the debonding module further comprises a second optical detection device disposed in the separation region, and the second optical detection device is configured to detect the carrier which is separated from the wafer.

7. The integrated wafer debonding and cleaning apparatus according to claim 1, wherein the debonding module further comprises a temporary storage area configured to store the carrier.

8. The integrated wafer debonding and cleaning apparatus according to claim 1, further comprising a positioning device and a turning mechanism, wherein the positioning device is configured to perform a central point positioning operation on the substrate to be processed, and the turning mechanism is configured to turn-over the substrate to be processed or the wafer.

9. A wafer debonding and cleaning method suitable for an integrated wafer debonding and cleaning apparatus, the integrated wafer debonding and cleaning apparatus comprising an input port, a debonding module, a wafer cleaning device, a first output port, a second output port, and a transport device, and the wafer debonding and cleaning method comprising:
   inputting a substrate to be processed into the integrated wafer debonding and cleaning apparatus through the input port, wherein the substrate to be processed comprises a wafer and a carrier which are bonded;
   transporting the substrate to be processed to the debonding module through the transport device;
   debonding the substrate to be processed and separating the wafer from the carrier by the debonding module;
   transporting the wafer to the wafer cleaning device through the transport device;
   cleaning the wafer by the wafer cleaning device;
   transporting the cleaned wafer and the carrier to the first output port and the second output port respectively by the transport device; and
   outputting the wafer and the carrier from the integrated wafer debonding and cleaning apparatus through the first output port and the second output port;

wherein the wafer cleaning device comprises a first chamber and a second chamber, and the wafer debonding and cleaning method further comprises:
transporting the wafer to the first chamber;
cleaning a first surface of the wafer in the first chamber;
taking the wafer out of the first chamber and turning it over;
transporting the turned-over wafer to the second chamber; and
cleaning a second surface of the wafer in the second chamber.

10. The wafer debonding and cleaning method according to claim 9, wherein the debonding module comprises a movable stage, a debonding region, and a debonding device, the debonding device is arranged in the debonding region, and the wafer debonding and cleaning method further comprises:
debonding the substrate to be processed by the debonding device when the substrate to be processed is moved onto the movable stage by the transport device and the movable stage is located in the debonding region.

11. The wafer debonding and cleaning method according to claim 9, wherein the debonding module further comprises a first optical detection device arranged in the debonding region, and the wafer debonding and cleaning method further comprises:
detecting the substrate to be processed by the first optical detection device before the substrate to be processed is debonded.

12. The wafer debonding and cleaning method according to claim 10, wherein when the substrate to be processed is debonded by the debonding device, the substrate to be processed is disposed between the movable stage and the debonding device, and the carrier of the substrate to be processed is arranged close to the debonding device, and the wafer is arranged away from the debonding device.

13. The wafer debonding and cleaning method according to claim 10, wherein the debonding module further comprises a separation region, the movable stage moves between the debonding region and the separation region, the debonding module further comprises a separation device arranged in the separation region, and the wafer debonding and cleaning method further comprises:
separating the carrier of the substrate to be processed from the wafer by the separation device when the debonded substrate to be processed is moved to the separation region by the movable stage.

14. The wafer debonding and cleaning method according to claim 13, wherein the debonding module further comprises a second optical detection device disposed in the separation region, and the wafer debonding and cleaning method further comprises:
detecting the carrier by the second optical detection device after the separation device separates the carrier from the wafer.

15. The wafer debonding and cleaning method according to claim 9, wherein the debonding module further comprises a temporary storage area configured to store the carrier.

16. The wafer debonding and cleaning method according to claim 9, wherein the integrated wafer debonding and cleaning apparatus further comprises a positioning device and a turning mechanism, the positioning device is configured to perform a central point positioning operation on the substrate to be processed, and the turning mechanism is configured to turn-over the substrate to be processed or the wafer.

* * * * *